United States Patent
Cooke et al.

(10) Patent No.: US 11,387,075 B2
(45) Date of Patent: Jul. 12, 2022

(54) SURFACE PROCESSING APPARATUS

(71) Applicant: Oxford Instruments Nanotechnology Tools Limited, Abingdon (GB)

(72) Inventors: Michael Cooke, Bristol (GB); Andrew Goodyear, North Somerset (GB)

(73) Assignee: Oxford Instruments Nanotechnology Tools, Ltd., Abingdon (GB)

(*) Notice: Subject to any disclaimer, the term of this patent is extended or adjusted under 35 U.S.C. 154(b) by 50 days.

(21) Appl. No.: 16/837,262

(22) Filed: Apr. 1, 2020

(65) Prior Publication Data
US 2020/0321192 A1    Oct. 8, 2020

(30) Foreign Application Priority Data
Apr. 2, 2019 (GB) .................................. 1904587

(51) Int. Cl.
| | |
|---|---|
| *H01J 37/32* | (2006.01) |
| *H01L 21/02* | (2006.01) |
| *H05H 1/46* | (2006.01) |

(52) U.S. Cl.
CPC ..... *H01J 37/3211* (2013.01); *H01J 37/32266* (2013.01); *H01J 37/32357* (2013.01);
(Continued)

(58) Field of Classification Search
CPC ......... H01J 2237/0437; H01J 2237/332; H01J 2237/334; H01J 37/32082; H01J 37/321;
(Continued)

(56) References Cited

U.S. PATENT DOCUMENTS

| | | | |
|---|---|---|---|
| 7,591,935 B2* | 9/2009 | Brcka | C23C 14/358 118/723 I |
| 10,734,200 B2* | 8/2020 | Chen | H01J 37/3244 |

(Continued)

FOREIGN PATENT DOCUMENTS

| | | |
|---|---|---|
| EP | 0704552 B1 | 4/1996 |
| EP | 1889946 A1 | 2/2008 |

(Continued)

OTHER PUBLICATIONS

EP Office Action for EP Application No. 20166698.9 dated Jul. 30, 2020.

*Primary Examiner* — Lan Vinh
(74) *Attorney, Agent, or Firm* — Fletcher Yoder P.C.

(57) ABSTRACT

This disclosure relates to a surface processing apparatus for use in the surface processing of a substrate. The surface processing apparatus comprises a plasma source including a wall defining a plasma chamber and an excitation source adjacent the wall and a processing chamber in which a substrate having a predetermined maximum lateral dimension is mounted in use, the processing chamber being operatively connected to the plasma source. A transmission plate for the transmission of plasma in use is arranged between the plasma source and processing chamber, the transmission plate comprising a plurality of apertures. The apertures follow a non-rectilinear path through the transmission plate such that there is no line of sight in use between a substrate with the predetermined maximum lateral dimension mounted in the processing chamber and the most intense region of the plasma in the plasma chamber.

18 Claims, 3 Drawing Sheets

(52) U.S. Cl.
CPC .. *H01J 37/32449* (2013.01); *H01J 37/32715* (2013.01); *H01L 21/0228* (2013.01); *H05H 1/46* (2013.01); *H01J 2237/0437* (2013.01); *H01J 2237/332* (2013.01); *H01J 2237/334* (2013.01)

(58) Field of Classification Search
CPC ............. H01J 37/3211; H01J 37/32266; H01J 37/32357; H01J 37/3244; H01J 37/32449; H01J 37/32633; H01J 37/32715; H01L 21/0228; H05H 1/46
USPC .............. 156/345.14, 345.19, 345.23, 345.3, 156/345.33
See application file for complete search history.

(56) References Cited

U.S. PATENT DOCUMENTS

| | | | |
|---|---|---|---|
| 2009/0008034 A1 | 1/2009 | Tahara et al. | |
| 2012/0073753 A1* | 3/2012 | Satoh ................ | H01J 37/32009 156/345.33 |
| 2017/0253972 A1* | 9/2017 | Ishibashi ........... | H01J 37/32357 |
| 2018/0122638 A1* | 5/2018 | Jung ................. | H01J 37/32633 |
| 2018/0358208 A1 | 12/2018 | Ma et al. | |

FOREIGN PATENT DOCUMENTS

| | | | |
|---|---|---|---|
| EP | 1889946 | A2 | 10/2009 |
| JP | H0831803 | A | 2/1996 |
| WO | 9859367 | A1 | 12/1998 |
| WO | 2017123589 | A1 | 7/2017 |

* cited by examiner

SURFACE PROCESSING APPARATUS

FOREIGN PRIORITY INFORMATION

This application claims priority to United Kingdom patent application number 1904587.1, filed 2 Apr. 2019.

The present invention relates to apparatus for the surface processing of a substrate, in particular apparatus that utilises high-density plasma to aid chemical vapour deposition or etching.

Chemical vapour deposition (CVD) and plasma etching are well-known processing methods used in the semiconductor and integrated circuit industry. In a standard process a semiconductor wafer is placed within a specialised reaction chamber and the surface of the wafer is exposed to various chemical substances, wherein the chemical substances are injected into the reaction chamber in gaseous form or within a carrier gas. The chemical substances typically comprise one or more volatile precursors, which react with and/or decompose upon the wafer substrate to alter the surface of the semiconductor wafer and provide the necessary processing in dependence on the chemistry of the substances involved. In many processes volatile gaseous by-products are also produced, which are removed using a gas flow through the reaction chamber. Surface reactions can either add new material or etch the existing surface. Common processing operations include the deposition of layers of material upon the wafer substrate and the etching of layers of material from the wafer substrate to form device components, electrical connections, dielectrics, charge barriers and other common circuit elements.

Plasma enhancement has been incorporated into processing systems in order to enhance the quality and/or processing rate of the surface process. These plasma-enhanced systems generally operate by the dissociation and ionisation of gaseous chemicals to increase the reactivity of the one or more chemical precursors. This enhanced reactivity due to energetic particles in the plasma increases the processing rate and allows lower processing temperatures to be used when compared to non-plasma systems. Plasma enhancement is particularly useful for etching processes.

The plasma can be generated in situ within the reaction chamber using a parallel plate (PP) system or generated remotely from reaction chamber and/or substrate and then transported into the reaction chamber.

High-density plasma (HDP) systems are typically those in which the generated ion or electron density is greater than $10^{11}$ cm$^{-3}$. This also raises the dissociation efficiency by an order of magnitude when compared to standard parallel plate systems. These enhanced plasma properties further increase the processing rate and/or quality of HDP processes by having two plasma excitation means, one to principally generate the plasma, the other to control ion bombardment energy at the substrate.

A common implementation of HDP utilises an inductively coupled plasma (ICP) source comprising a plasma generation chamber encircled by an inductively coupled coil. This coil is driven with a RF supply in order to generate an electric field within the plasma generation chamber, which in turn in creates and ignites a plasma cloud. A variety of RF frequencies can be used including low frequencies (below 500 kHz), high frequencies (2 MHz-13.56 MHz) or microwave frequencies (where the coil is replaced with a microwave cavity) (2.45 GHz). By locating the plasma source remotely to the processing chamber, ICP systems allow high-density plasma to be generated remotely without affecting the surface processes within the processing chamber.

Two or more gases or gas mixtures can be injected into an ICP HDP system: a first gas or gas mixture is injected into the ICP generation chamber and a second gas or gas mixture is injected into the substrate reaction chamber. The generated electric field accelerates the electrons of the first gas within the plasma generation chamber, which ionises individual gas molecules and allows for the transfer of kinetic energy within individual electron-gas molecule collisions.

A known HDP system is described in EP-A-1889946. This system includes a transmission plate positioned between the plasma source and the processing chamber. The transmission plate includes one or more apertures positioned to provide a predetermined processing pattern upon the surface of the substrate. Another example of this type of apparatus is described in U.S. Pat. No. 6,083,363.

It is desirable to process substrates by plasma with minimum damage to the material that remains after processing. Most work in the past has considered ion bombardment damage with the result that low ion energy schemes such as atomic layer etching have been devised. As well as providing an ion flux and a radical flux to the substrate, it has been recognised that plasma sources also generate a photon flux typically corresponding to ultraviolet (UV) wavelengths, which also contribute to the etching process. Recent work (Atomic layer etching of AlGaN using Cl2 and Ar gas chemistry and UV damage evaluation, Hiroyuki Fukumizu, Makoto Sekine, Masaru Hori, Koji Kanomaru, and Takuo Kikuchi Citation: Journal of Vacuum Science & Technology A 37, 021002 (2019); doi: 10.1116/1.5063795) has shown that atomic layer etching can give higher device damage than conventional etching, attributed to extended exposure to ultraviolet light. A previous attempt to limit UV damage is disclosed in U.S. Pat. No. 6,083,363 but any attenuation of (UV) light from such a scheme also attenuates the processing flux in the same proportion, so the total dose of UV during a process is likely to be the same, with or without an additional screen.

Other previous attempts to limit radiation damage to substrates are described in US-A-2009/0008034 and WO-A-2017/123589. Barriers are placed between the plasma source and the substrate, and through-holes formed in the barriers allow particles such as radicals and charged species from the plasma to reach the substrate.

In accordance with the present invention, we provide a surface processing apparatus for use in the surface processing of a substrate, the surface processing apparatus comprising:
  a plasma source including a wall defining a plasma chamber and an excitation source adjacent the wall;
  a processing chamber in which a substrate having a predetermined maximum lateral dimension is mounted in use, the processing chamber being operatively connected to the plasma source; and
  a transmission plate for the transmission of plasma in use between the plasma source and processing chamber, the transmission plate comprising a plurality of apertures, characterised in that the apertures follow a non-rectilinear path through the transmission plate such that there is no line of sight in use between a substrate with the predetermined maximum lateral dimension mounted in the processing chamber and the most intense region of the plasma in the plasma chamber.

In this invention, we adapt the transmission plate that is already in position, so as to avoid a line of sight between the substrate mounted in the processing chamber and the brightest or most intense region of the plasma. This is achieved by the provision of apertures configured in the manner defined above, each following a non-rectilinear path through the transmission plate, which results in there being no line of sight between the substrate and the most intense region of the plasma. In this way, the exposure of the substrate to light, typically ultraviolet light, from the most intense region of the plasma is minimised while there is still sufficient flux of charge particles and radicals to the substrate to perform processing.

The transmission plate may be formed with a central portion which is opaque to light wavelengths of interest, the lateral extent of the opaque portion being such that there is no line of sight in use between a substrate with the predetermined maximum lateral dimension mounted in the processing chamber and the most intense region of the plasma in the plasma chamber. Where an opaque central portion is provided, the opaque portion preferably will attenuate photon flux by at least a factor of $10^6$. However, in more preferred embodiments, the apertures are regularly spaced from one another across at least a central portion of the transmission plate, preferably across substantially all of the transmission plate. For example, the apertures may be arranged in a regular array. The aperture spacing may additionally or alternatively be tailored to adjust the uniformity of processing at the substrate. The apertures are thus provided across the full extent of the transmission plate. This is possible because the non-rectilinear shape of the apertures ensures that there is no line of sight between the substrate table and the most intense region of the plasma irrespective of where the apertures are located. The uniformity of the distribution of ions and radicals across the surface of the substrate in the processing chamber is improved in these preferred embodiments.

As a result of the provision of non-rectilinear apertures described above, the line of sight condition can be achieved using a single transmission plate. Hence, in preferred embodiments, the surface processing apparatus comprises exactly one transmission plate. This is advantageous as the flux of radiation reaching the substrate is reduced (as a result of there being no line of sight from the most intense region of the plasma to the substrate), but does not impede the flow of charged species and radicals from the plasma source to the substrate to the same extent as plural transmission plates in combination. Moreover, the construction of the surface processing apparatus may be made particularly compact since there is no need to allow space for particles from the plasma to pass through multiple transmission plates. In other embodiments, however, there may be provided at least two transmission plates located one above the other. The apertures of one transmission plate may be laterally offset from apertures of the other transmission plate, although this is not essential as each transmission plate individually meets the line of sight condition.

Preferably the surface processing apparatus comprises a substrate table inside the processing chamber. The substrate table is adapted such that a substrate having the maximum lateral dimension can be mounted on the substrate table in use. Accordingly, there is no line of sight in use between the substrate table and the most intense region of the plasma in the plasma chamber.

The lateral boundary of the most intense region of the plasma in the plasma chamber is conveniently defined as the part of the plasma source wall adjacent to that part of the excitation source closest to the transmission plate. The vertical boundary of the most intense region of the plasma may be defined as the vertical position of the part of the plasma source wall adjacent to that part of the excitation source closest to the transmission plate.

Preferably, the transmission plate comprises a plurality of circular apertures wherein the diameter of each circular aperture is close to or greater than the thickness of the transmission plate. The ratio between the diameter of each aperture and the transmission plate thickness should typically be in the range of 0.5:1 to 1.5:1. This then allows a transmission plate to be used without destroying the majority of the active species making up the plasma. Typically, the transmission plate will be circular in form in correspondence with a substantially cylindrical plasma source and processing chamber. In these cases the plasma source is typically axially aligned with the processing chamber, which is mounted below the plasma source.

Preferably, the plasma source generates an inductively coupled plasma and comprises a plasma chamber and an RF driven inductively coupled coil. Common drive parameters for the RF source are a frequency of 2 MHz and a power of 1 to 3 kW. In this case, conveniently the part of the excitation source closest to the transmission plate(s) is the coil segment of the inductively coupled coil closest to the substrate.

Typically, the apparatus uses two gas or gas mixture supplies: a first gas or gas mixture supply to the plasma source and a second gas or gas mixture supply to the processing chamber. Typical surface processing of the substrate comprises deposition or removal of material on or from the surface of the substrate. In some embodiments the physical form of the one or more apertures and/or the distribution of the one or more apertures is adapted to provide a substantially uniform deposition or material removal rate across a width of the substrate.

To prevent the thermal degradation of the transmission plate, and to limit particles flaking from the transmission plate through thermal cycling, the thermal conductivity of the plate is typically greater than 100W m-1 K-1 and the plate is thermally connected to an external chamber via a low thermal resistance path. The transmission plate can comprise either a metal or metal alloy plate. Alternatively a lower thermal conductivity material can be used with a lower thermal expansion coefficient, which can operate at higher temperatures, such as alumina ceramic. Where the transmission plate is to be used with chlorine-containing gas mixtures for etching, then alumina is preferred. It is also possible to use anodised aluminium or metal coated with a material more inert to the reactive plasma, such as plasma-sprayed alumina, to combine the beneficial effects of improved lateral heat conduction with inertness to the plasma.

The surface processing apparatus may be adapted to perform deposition or etching but is particularly suited to atomic layer etching.

In order that the invention may be better understood, some embodiments of the invention will now be described with reference to the accompanying drawings in which.

Figure 1:
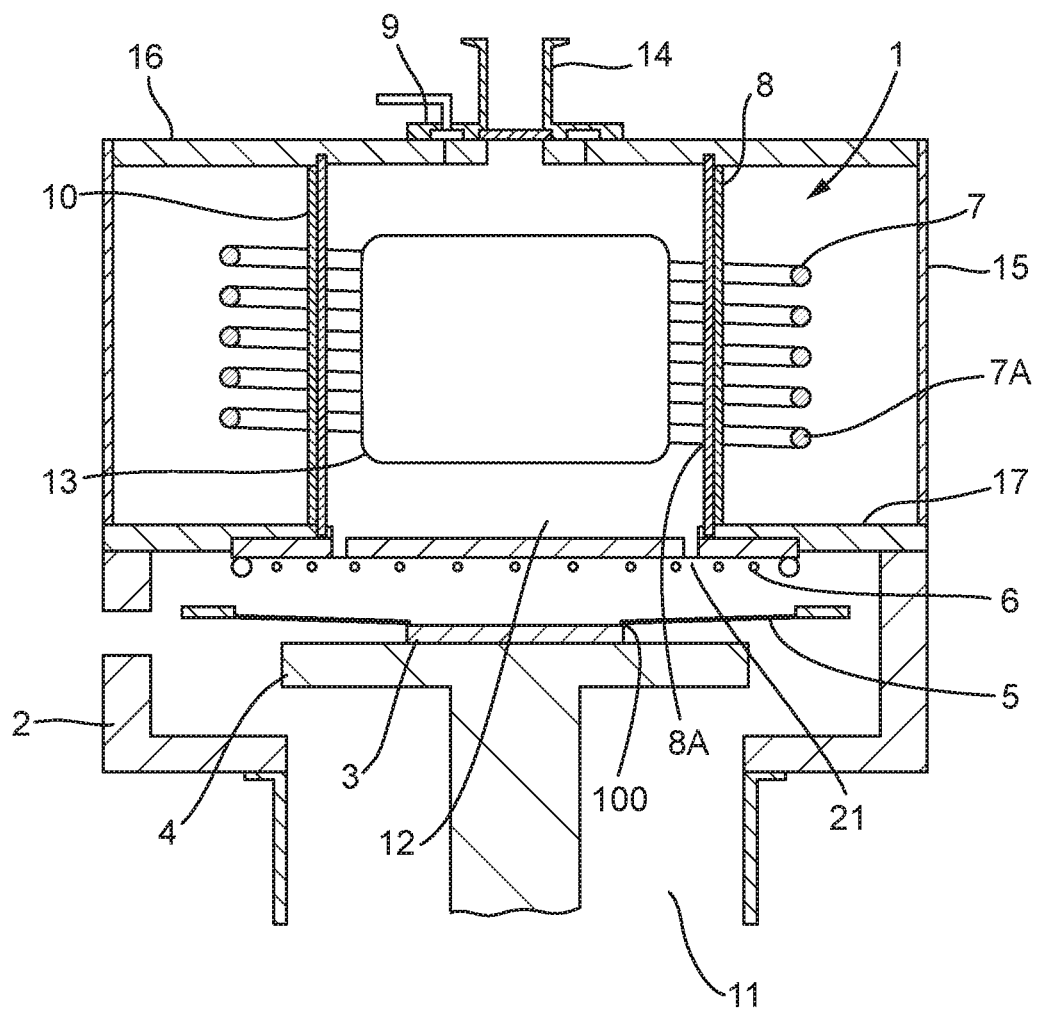
FIG. 1 illustrates a surface processing apparatus according to the present invention.

FIG. 1 is a schematic illustration of a high-density plasma processing system. The system consists of two main components: a plasma source 1 and a processing chamber 2. The plasma source comprises a plasma chamber 8 constructed from a dielectric cylindrical tube with a vertical axis surrounded by an electrostatic shield 10.

Typically, quartz or alumina is used as the dielectric. At the top of the cylindrical tube 8 is a set of gas inlets 9, which have an axially symmetric distribution and are used to inject a first gas or gas mixture into the plasma chamber used in the plasma generation. Beneficially, this first gas mixture includes a noble gas such as argon. This gas or gas mixture is ionised and excited within the plasma source 1, then transports to the processing chamber 2 by a combination of flow and diffusion.

Surrounding this plasma chamber 8 is a cooled radio frequency (RF) coil antenna 7 that forms an inductively coupled coil for use in generating the plasma within the plasma chamber 8. The RF coil 7 is connected to a 2 MHz, 3 kW RF generator via a matching unit (not shown). Effectively, the current passing through the RF coil 7 generates an RF magnetic flux along the axis of the plasma chamber 8 and this magnetic flux further induces an RF electric field inside the plasma chamber 8. The induced electric field accelerates electrons within the injected gas cloud producing high-density plasma within the plasma chamber. By controlling the inductively coupled RF coil 7, an operator can control the dissociation of the plasma and the density of the incident ions in the plasma chamber 8. The most intense plasma is represented in FIG. 1 by region 13.

An inspection port 14 may be provided to observe the plasma. The top plate 16, side cover 15 and plasma source base plate 17 form an enclosure to contain RF radiation from the RF coil 7.

Below the plasma source 1 is the processing chamber 2, which is axially aligned with the plasma chamber 8. The processing chamber 2 typically comprises a substrate table 4 made from a cooled or heated lower electrode with helium assisted heat transfer. This table can be electrically grounded for deposition, or powered by a separate RF supply to control the ion impact energy at the substrate surface for etching. A wafer substrate 3 is placed upon this substrate table 4 and can be further held in place using a modular clamping mechanism 5 or an electrostatic clamp. The processing chamber 2 is typically kept at low pressure or within a vacuum by evacuation using a turbomolecular pump backed by a mechanical pump, via a pumping port 11 mounted beneath the substrate table 4. In this example, the pumping port 11 is a 200 mm diameter high conductance pumping port. A ring of gas nozzles is provided in an annulus 6 at the top of the processing chamber 2, through which a gas or gas mixture is injected. In processes to deposit silicon compounds, the silicon-bearing gas such as silane is included in this gas mixture. In etching processes, high molecular weight vapours such as hexafluoroacetylacetone are injected directly to the chamber and lower molecular weight gases such as chlorine, nitrous oxide or oxygen are injected in the plasma source. Beneficially, a noble gas such as argon forms part of this mixture.

In use plasma 13 is generated within the plasma source 1 by providing the appropriate RF current to the ICP coil.

A transmission plate 12 is mounted between the plasma source 1 and the processing chamber 2 and the plasma 13 is driven through the transmission plate 12, which modifies the electron distribution in the plasma cloud.

Figure 2:
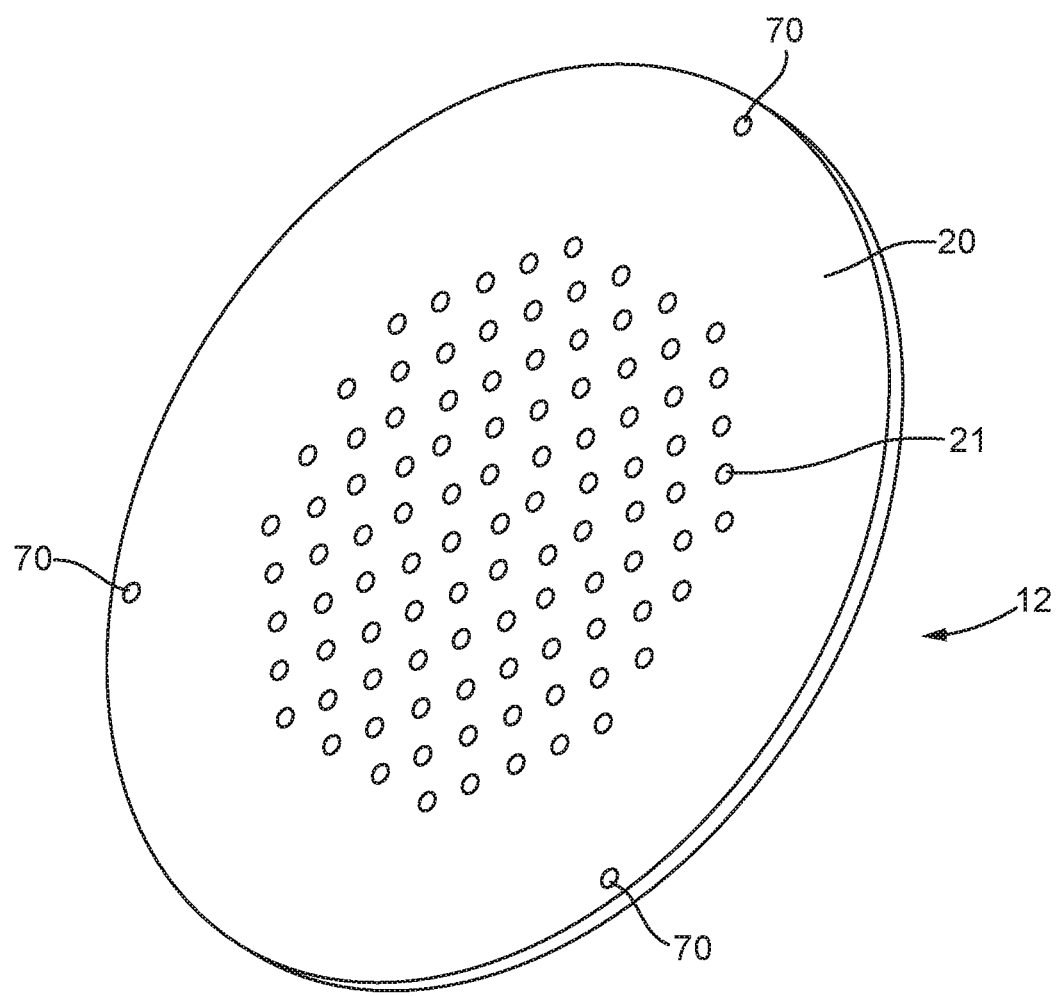
FIG. 2 is an illustration of a 3D model of a transmission plate for use in the apparatus of FIG. 1.

An example of the transmission plate 12 is shown in FIG. 2. The transmission plate 12 shown in FIG. 2 comprises a regular array of circular apertures 21. In this example the apertures 21 are arranged in a hexagonal array and are regularly spaced from one another across a central portion of the transmission plate 12. The lateral extent of the array could be chosen to match the maximum lateral dimension of substrates that can be accommodated by the substrate table 4, for example. The apertures 21 could alternatively be arranged in one or more concentric rings, for example. Typically, the circular disc 20 is manufactured from aluminium alloy no. 6082 with a thickness of between 4 to 10 millimetres. To allow a maximum transmission of plasma species while eliminating the line of sight through the transmission plate 12, the diameter of the apertures 21 measured in the plane of the surface of the transmission plate 12 is preferably in the range of 0.5 to 1.5 times the thickness of the transmission plate 12. Hence, using the aluminium alloy above, the diameter of the circular apertures is between 3 and 6 mm, with the diameter of all apertures preferably greater than 5 mm. An aperture diameter greater than 3 mm will begin to demonstrate favourable transmission characteristics. The transmission plate 12 is connected to the external chamber by three connecting points 70.

The arrangement of apertures 21 and their sizes can be determined according to the desired electron distribution in the plasma cloud to impinge upon the wafer substrate 3 as is described in more detail in EP-A-1889946 subject to the constraints described below.

Figure 3:
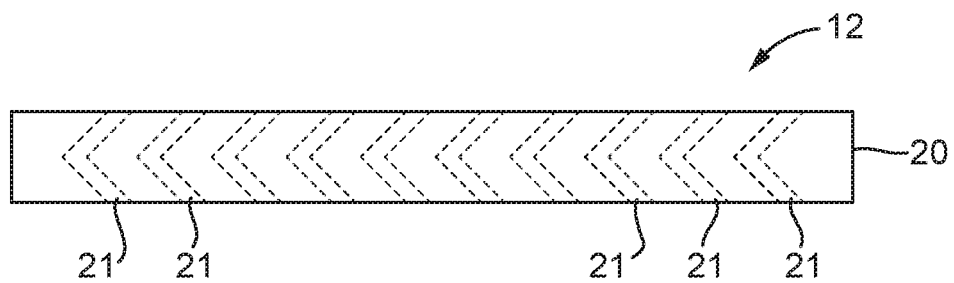
FIG. 3 illustrates schematically a first exemplary transmission plate.

The present invention is concerned with the recognition that the plasma also generates photons of light, particularly ultraviolet light, which can undesirably damage the wafer substrate 3. The invention particularly benefits processes intended to minimise residual damage to the substrate, such as atomic layer etching. To solve this problem, the transmission plate 12 is designed to prevent there being a direct line of sight between the majority of the plasma 13, in particular the most intense region of the plasma 13, and the wafer substrate 3. The most intense region of the plasma 13 will be within the volume defined by the turns or segments of the coil 12. The apertures 21 each follow a non-rectilinear path through the transmission plate 12 such that there is no direct line of sight between the wafer substrate 3 and the most intense region of the plasma 13. This is best seen in FIG. 3, which shows a cross-sectional view of the transmission plate 12. The apertures 21 exhibit a change of direction as they pass through the plate (i.e. are non-rectilinear) so that there is no direct line of sight through the apertures from one side to the other. In this example, the apertures are each formed by two linear sections, which each extend into the transmission plate at an angle to the plane of the plate that is preferably in the range of 15 to 45 degrees. In this example the angle is about 20 degrees (and the two linear sections thus meet at about 40 degrees to one another inside the plate).

Figure 4:
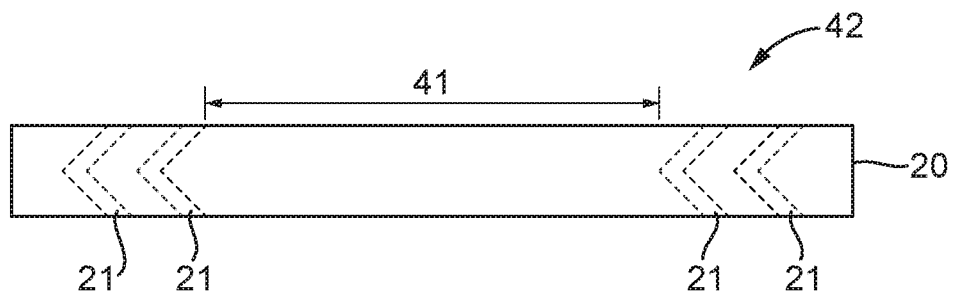
FIG. 4 illustrates a second exemplary transmission plate.

In the example of FIG. 3, apertures are provided across a central portion of the plate 12 as described above. This allows the transmission plate to be used for further control of the distribution of electrons across the wafer as described in more detail in EP-A-1889946. However, in other exemplary transmission plates, apertures 21 could be omitted from a central portion 41 of the transmission plate 42 as shown in FIG. 4. In this latter example, the condition of preventing a direct line of sight with the most intense region of the plasma is further assured because the intensity of the plasma diminishes close to the wall of the plasma chamber.

In practice, the line of sight condition can be achieved by configuring the apertures 21 such that there is no direct line of sight between the wafer 3 and a location on the plasma wall 8, indicated at 8A, nearest to the closest excitation point corresponding, in this case, to the lowest coil segment 7A of the RF coil 7.

In practice, the design of the transmission plate 12 will define a maximum lateral dimension of the wafer substrate 3 so that wafers less than that maximum dimension (for example less than 100 mm) can all be used with the same transmission plate 12.

If provided, the opaque central portion of the transmission plate may have a 200 mm diameter for use with a 100 mm wafer while in another example the opaque portion may have a 250 mm diameter for use with a wafer having a 200 mm diameter. However, in preferred implementations there is no opaque central portion and the apertures are regularly spaced from one another as shown in FIGS. 2 and 3.

The transmission plates described herein are suitable for use with the PlasmaPro 100 processing tool manufactured by Oxford Instruments, Bristol, UK.

With this structure, damage due to photons is significantly reduced compared with an unshielded source. Thus, we have shown that a plate 12 of this design reduces the ion flux to the substrate 3 by approximately a factor 10 compared to an unshielded source, but the ion flux can be restored by increasing the plasma power to the source.

We have also shown that the ion energy at the wafer substrate 3 (in the absence of additional electrical bias to the wafer table 4) is reduced from 10 eV to 5 eV, further reducing the potential for ion bombardment damage. This is likely due to the 'downstream' character of the shielded plasma source, with a lower electron temperature. The distribution of ion energy when bias is added is similar with and without the shield in place.

Additionally, the plate and/or chamber walls or liners can be coated with an anti-reflective material (e.g. anodisation or similar) to minimise reflection of light.

The plate would typically be grounded, but could be powered by RF or DC to influence the transmission of ions.

This configuration will not prevent all photons from reaching the wafer substrate 3 but will significantly attenuate exposure to light. In particular, it will significantly reduce light with photon energy of about 3 eV or higher which is capable of modifying chemical bonds and thereby damaging solid material.

The plasma source power may be increased in order to compensate for any reduction in the flux of ions received at the substrate when the transmission plate is present (relative to the flux received when no transmission plate is provided). It is expected that the transmission plate will alter the ion velocity distribution function of ions inside the processing chamber in such a way as to reduce the electron temperature below the plate (again relative to when no transmission plate is provided). This reduces the production of high energy photons close to the substrate, and also reduces the minimum ion energy impacting on the substrate in the absence of additional bias energy at the table. Both of these are beneficial to an atomic layer etch process, by reducing photon damage to the remaining solid material, and improving control of low ion energy bombardment.

Alternative embodiments to those described above utilise two or more transmission plates arranged one above the other.

The invention claimed is:

1. A surface processing apparatus for use in the surface processing of a substrate, the surface processing apparatus comprising:
    a plasma source that generates plasma in a plasma chamber and including a wall defining the plasma chamber and an excitation source adjacent the wall;
    a processing chamber in which a substrate having a predetermined maximum lateral dimension is mounted in use, the processing chamber being operatively connected to the plasma source; and
    a transmission plate for transmission of plasma in use between the plasma source and processing chamber, the transmission plate comprising a plurality of apertures, characterised in that the apertures follow a non-rectilinear path through the transmission plate such that there is no line of sight in use between the substrate with the predetermined maximum lateral dimension mounted in the processing chamber and a majority of a most intense region of the plasma generated in the plasma chamber.

2. The surface processing apparatus of claim 1, wherein a central portion of the transmission plate is opaque to light wavelengths in the ultraviolet range, the lateral extent of the central portion being such that there is no line of sight in use between the substrate with the predetermined maximum lateral dimension mounted in the processing chamber and the most intense region of the plasma in the plasma chamber.

3. The surface processing apparatus of claim 1, comprising exactly one transmission plate.

4. The surface processing apparatus of claim 1, wherein the apertures are regularly spaced from one another across at least a central portion of the transmission plate, preferably across substantially all of the transmission plate.

5. The surface processing apparatus of claim 1, wherein the lateral boundary of the most intense region of the plasma in the plasma chamber is defined as a part of the wall of the plasma source adjacent to that part of the excitation source closest to the transmission plate.

6. The surface processing apparatus of claim 1, wherein a ratio of aperture diameter to transmission plate thickness is greater than 3:1.

7. The surface processing apparatus of claim 1, wherein the apertures are circular apertures, with a diameter of each circular aperture being greater than 5 mm.

8. The surface processing apparatus of claim 1, wherein the surface processing of the substrate comprises removal of material from the surface of the substrate.

9. The surface processing apparatus of claim 1, wherein a thermal conductivity of the transmission plate is greater than 100 W m-1 K-1.

10. The surface processing apparatus of claim 1, wherein the transmission plate is thermally connected to the processing chamber via a low thermal resistance path.

11. The surface processing apparatus of claim 1, wherein the surface processing apparatus is adapted to perform atomic layer etching.

12. The surface processing apparatus of claim 1, wherein the transmission plate comprises a ceramic plate, or an alumina plate.

13. The surface processing apparatus of claim 1, wherein the transmission plate comprises a metal or metal alloy plate.

14. The surface processing apparatus of claim 13, wherein the metal or metal alloy plate is coated with a layer resistant to attack by the plasma.

15. The surface processing apparatus of claim 1, wherein the plasma source is an inductively coupled plasma.

16. The surface processing apparatus of claim 15, wherein the plasma source comprises the plasma chamber and an inductively coupled coil.

17. The surface processing apparatus of claim 16, wherein the inductively coupled coil is connected to a radio frequency (RF) source.

18. The surface processing apparatus of claim 16, wherein a part of the excitation source closest to the transmission plate is a coil segment of the inductively coupled coil closest to the substrate.

* * * * *